(12) United States Patent
Fujii

(10) Patent No.: US 6,504,453 B2
(45) Date of Patent: Jan. 7, 2003

(54) TRANSVERSAL SURFACE ACOUSTIC WAVE FILTER

(75) Inventor: Yasuhisa Fujii, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/981,792

(22) Filed: Oct. 19, 2001

(65) Prior Publication Data

US 2002/0105392 A1 Aug. 8, 2002

(30) Foreign Application Priority Data

Nov. 17, 2000 (JP) ........................................ 2000-351271
May 30, 2001 (JP) ........................................ 2001-163121

(51) Int. Cl.[7] ................................................ H03H 9/64
(52) U.S. Cl. ........................ 333/193; 333/195; 333/196; 310/313 C; 310/313 D
(58) Field of Search ................................ 333/193–196; 310/313 R, 313 B, 313 C, 313 D

(56) References Cited

U.S. PATENT DOCUMENTS

| 5,357,228 A | * | 10/1994 | Dufilie | 333/195 |
| 5,379,010 A | * | 1/1995 | Ruile et al. | 333/195 |
| 5,896,072 A | * | 4/1999 | Bergmann et al. | 333/195 |
| 6,104,260 A | * | 8/2000 | Yamada et al. | 333/193 |

FOREIGN PATENT DOCUMENTS

| EP | 0 140 618 | | 7/1991 | |
| JP | 2-305016 | * | 12/1990 | 333/193 |
| JP | 11-186865 | | 7/1999 | |

* cited by examiner

Primary Examiner—Robert Pascal
Assistant Examiner—Barbara Summons
(74) Attorney, Agent, or Firm—Keating & Bennett, LLP

(57) ABSTRACT

In a transversal surface acoustic wave filter, an interdigital transducer on the input side, an interdigital transducer on the output side, and a reflector are arranged in the surface acoustic wave propagation direction on a piezoelectric substrate. While a surface acoustic wave passes through the interdigital transducer on the output side and while the surface acoustic wave reflecting from the reflector passes through the interdigital transducer on the output side, the surface acoustic wave is converted to first and second electrical signals, respectively. The interval between the reflector and the interdigital transducer on the output side is set so that no phase difference is generated between the first and second electrical signals. The interdigital transducer on the output side adjacent to the reflector is weighted so that a part of the interdigital transducer on the output side having the highest excitation intensity is positioned on the reflector side thereof.

19 Claims, 9 Drawing Sheets

TRANSVERSAL SURFACE ACOUSTIC WAVE FILTER

BACKGROUND OF THE INVENTION

1. Field of the Invention

The present invention relates to a transversal surface acoustic wave filter and more particularly, to a transversal surface acoustic wave filter having a reflector or a reflection end surface provided on the outer surface in the surface acoustic wave propagation direction of at least one of an interdigital transducer (hereinafter, referred to as "IDT") on the input side and an IDT on the output side.

2. Description of the Related Art

Surface acoustic wave filters have been widely used as band filters used in cellular telephones or other telecommunications devices. More specifically, as band filters used in the IF stages of such devices, transversal surface acoustic wave filters are known.

The transversal surface acoustic wave filters are characterized in that the ground delay time deviation curve is flat, and the attenuation near the pass band is sufficient. Accordingly, the transversal surface acoustic wave filters are suitable for use as IF filters. In recent years, the IF filters in cellular telephones operating in the CDMA system have been required to have a wide band characteristic. The transversal surface acoustic wave filters can easily meet such requirement for the wide band characteristic.

However, the transversal surface acoustic wave filters have a large insertion loss, and have a very large size.

Thus, conventionally, various attempts have been made to reduce the insertion loss of the transversal surface acoustic wave filters and reduce the size thereof (for example, see Japanese Unexamined Patent Application Publication No. 11-186865 and EP 0140618B1).

FIG. 12 is a schematic plan view of an example of a conventional transversal surface acoustic wave filter. In this filter, an IDT 101 on the input side and an IDT 102 on the output side are arranged in the surface acoustic wave propagation direction on a piezoelectric substrate. The IDT on the input side is thinning-out weighted so that a desired characteristic can be obtained, and moreover, a unidirectional electrode 103 is disposed inside the IDT to reduce the insertion loss.

FIG. 13 is a schematic plan view of another example of the conventional transversal surface acoustic wave filter, and illustrates the configuration disclosed in Japanese Unexamined Patent Application Publication No. 11-186865. In a transversal surface acoustic wave filter 201, an IDT 203 on the input side, an IDT 204 on the output side, and a reflector 205 are arranged in the surface acoustic wave propagation direction, and moreover, similarly, an IDT 206 on the input side, an IDT 207 on the output side, and a reflector 208 are formed and arranged in the surface acoustic wave propagation direction on the side of the configuration in which the IDT 203 on the input side, the IDT 204 on the output side, and the reflector 205 are arranged. The polarities of the IDTs 206 and 207 are opposite to those of the IDTs 203 and 204.

The IDTs 203 and 206 on the input side are connected in common, that is, are connected to an input terminal IN. The IDTs 204 and 207 are connected in common, that is, are connected to an output terminal OUT.

The IDT 203 on the input side and the IDT 204 on the output side are arranged at an interval W1, and the IDT 206 on the input side and the IDT 207 on the output side are arranged at an interval W3. The intervals W1 and W2 are equal to each other.

The interval W2 between the IDT 204 on the output side to the reflector 205 in the surface acoustic wave propagation direction is not equal to the interval W4 between the IDT 207 on the output side to the reflector 208. That is, the intervals W2 and W4 satisfy W2−W4=λ/4, in which λ is the wavelength of a surface acoustic wave.

Referring to the transversal surface acoustic wave filter 201, electrical signals are input to the input IDTs 203 and 206 and are converted to surface acoustic waves. These surface acoustic waves are propagated toward the output IDTs 204 and 207. The output IDTs 204 and 207 are arranged so that the surface acoustic waves can pass through the output IDTs 204 and 207 while the waves are not converted to electrical signals. The surface acoustic waves passed through the output IDTs 204 and 207 are reflected by the reflectors 205 and 208. The reflected surface acoustic waves are converted to electrical signals by the output IDTs 204 and 207, and are output therefrom. According to this configuration, the polarities of the IDTs 206 and 207 are opposite to those of the IDTs 203 and 204, respectively. Since the intervals W2 and W4 satisfy W2−W4=λ/4, the phase of the surface acoustic waves is the same as those of the surface acoustic waves reflected by the reflectors 205 and 208. Thus, the electrical signals having the same phase are output from the output IDTs 204 and 207.

The transversal surface acoustic wave filter 201 shown in FIG. 13 utilizes the weighting of the input IDTs 203 and 204 and the output IDTs 206 and 207, the characteristics determined by the position in which the reflection electrode of the unidirectional electrode or the like, and moreover, the reflection characteristics of the reflectors 205 and 208. Thus, the attenuation near the pass band can be increased.

In recent years, the reduction in size and weight of mobile communication devices such as cellular telephones or other devices has been advanced. Accordingly, the IF filters for use in the mobile communication devices have been required to have much smaller sizes.

However, the bandwidth of the pass band of the transversal surface acoustic wave filter shown in FIG. 12 is determined mainly by the number of the electrode finger pairs of each IDT. Thus, when the size of the transversal surface acoustic wave filter is reduced, a required bandwidth must be considered. Accordingly, it has been difficult to reduce the number of the paired electrode fingers of each IDT.

Moreover, to obtain the characteristic of the attenuation steeply changing near the pass band, it is necessary to sufficiently weight the IDTs on the input and output sides. As a result, the total number of the electrode finger pairs of the IDTs must be increased.

Referring to the transversal surface acoustic wave filter 201 shown in FIG. 13, surface acoustic waves excited by the input IDTs 203 and 206 pass through the output IDTs 204 and 207 in which the surface acoustic waves are electrically cancelled out, and are reflected by the reflectors 205 and 208. Thereafter, the surface acoustic waves are converted to electrical signals by the output IDTs 204 and 207. On the other hand, no mechanical reflections from the output IDTs 204 and 207 should be generated so that the surface acoustic waves can pass through the output IDTs 204 and 207 as they are. Thus, it has been necessary that the output IDTs 204 and 207 comprise split electrodes only, which generate no mechanical reflections.

However, only the surface acoustic waves reflected by the reflectors 205 and 208, that is, only the surface acoustic waves propagated from the input side and entering the reflectors 205 and 208 are output as electrical signals from the output IDTs 204 and 207. Therefore, the bidirectional loss 3dB in the transversal surface acoustic wave filter is caused. It is impossible to reduce the insertion loss.

To sufficiently increase the attenuation near the pass band, it is not satisfactory to simply consider the reflection characteristics of the reflectors 205 and 208. The surface acoustic wave filter 201 is also required to increase the number of the paired electrode fingers of the IDTs 203 and 204 and 205 and 206 on the input and output sides similarly to the transversal surface acoustic wave filter shown in FIG. 12. Thus, the insertion loss is large, and it is difficult to reduce the size of the elements.

SUMMARY OF THE INVENTION

In order to overcome the problems described above, preferred embodiments of the present invention provide a transversal surface acoustic wave filter that achieves sufficient attenuation near the pass band and miniaturization in size while solving the problems with conventional devices.

According to a first preferred embodiment of the present invention, a transversal surface acoustic wave filter includes a piezoelectric substrate, an interdigital transducer on the input side and an interdigital transducer on the output side arranged in the surface acoustic wave propagation direction on the piezoelectric substrate, and a reflector disposed on the outer area in the surface acoustic wave propagation direction of one of the interdigital transducer on the input side and the interdigital transducer on the output side, the interdigital transducer adjacent to the reflector being weighted, wherein while a surface acoustic wave passes through the interdigital transducer adjacent to the reflector and while the surface acoustic wave reflecting from the reflector passes through the interdigital transducer adjacent to the reflector, the surface acoustic wave is converted to first and second electrical signals, respectively, and the interval between the reflector and the interdigital transducer adjacent to the reflector is arranged such that no phase difference is generated between the first and second electrical signals, and the interdigital transducer adjacent to the reflector is weighted so that a portion of the interdigital transducer having the highest excitation intensity is positioned on the reflector side thereof.

Preferably, in the interdigital transducer adjacent to the reflector which is sectioned with respect to the approximate center in the surface acoustic wave propagation direction thereof into a first group and a second group arranged in the order from the reflector side thereof, the absolute value of the integral value of excitation intensity of the electrode finger pairs of the first group is larger than that of the electrode finger pairs of the second group.

Also, preferably, in the interdigital transducer adjacent to the reflector which is sectioned into a first group, a second group, and a third group arranged in the order from the reflector side thereof, the excitation intensity integral value of the electrode finger pairs of the first group is at least about 80% of the excitation intensity integral value of the electrode finger pairs of a first group including a normal type interdigital transducer.

Preferably, the size in the surface acoustic wave propagation direction of the reflector is shorter than that of the interdigital transducer adjacent to the reflector.

Preferably, the reflectivity of the reflector measured at the center frequency is substantially 100%.

Also, preferably, the interval L between the weighted interdigital transducer and the reflector is within the range expressed by $(n/2-1/8)\lambda \pm 0.04\ \lambda$ in which $\lambda$ is the length of one period in the weighted interdigital transducer, and n is a natural number.

Preferably, the transversal surface acoustic wave filter further includes a reflector disposed on the outer side in the surface acoustic wave propagation direction of the interdigital transducer opposite to the weighted interdigital transducer.

According to a second preferred embodiment of the present invention, a transversal surface acoustic wave filter includes a piezoelectric substrate, and an interdigital transducer on the input side and an interdigital transducer on the output side arranged in the surface acoustic wave propagation direction on the piezoelectric substrate, the end surface of the piezoelectric substrate on the outer area of one of the interdigital transducer on the input side and the interdigital transducer on the output side constituting a reflection end surface, the interdigital transducer adjacent to the end surface being weighted, wherein while a surface acoustic wave passes through the weighted interdigital transducer adjacent to the reflection end surface and while the surface acoustic wave reflecting from the reflection end surface passes through the weighted interdigital transducer, the surface acoustic wave is converted to first and second electrical signals, respectively, and the interval between the reflection end surface and the interdigital transducer adjacent to the reflection end surface is arranged such that no phase difference is generated between the first and second electrical signals, the interdigital transducer adjacent to the reflection end surface is weighted so that a portion of the interdigital transducer having the highest excitation intensity is positioned on the reflection end surface side thereof.

Preferably, in the interdigital transducer adjacent to the reflection end surface which is sectioned with respect to the approximate center in the surface acoustic wave propagation direction thereof into a first group and a second group arranged in the order from the reflection end surface side thereof, the absolute value of the integral value of excitation intensity of the electrode finger pairs of the first group is larger than that of the electrode finger pairs of the second group.

Also, preferably, in the interdigital transducer adjacent to the reflection end surface which is sectioned into a first group, a second group, and a third group arranged in the order from the reflection end surface side thereof, the excitation intensity integral value of the electrode finger pairs of the first group is at least about 80% of the excitation intensity integral value of the electrode finger pairs of a first group including a normal type interdigital transducer.

Preferably, the interval L between the weighted interdigital transducer and the reflector is in the range expressed by $n\lambda/2 \pm 0.04\ \lambda$ in which n is or a natural number.

Preferably, the weighted interdigital transducer includes a split electrode. More preferably, all of the electrode fingers of the weighted interdigital transducer are split electrodes.

Preferably, the transversal surface acoustic wave filter further includes an electrode that is constructed to mechanically reflect a surface acoustic wave in the weighted interdigital transducer.

Preferably, a communication device including one of the above-described transversal surface acoustic wave filters as a band-pass filter is provided.

Other features, elements, characteristics and advantages of the present invention will become apparent from the following detailed description of the preferred embodiments thereof with reference to the attached drawings.

DETAILED DESCRIPTION OF PREFERRED EMBODIMENTS

The present invention will be more apparent from the following description of preferred embodiments of the present invention made with reference to the drawings.

Figure 1:
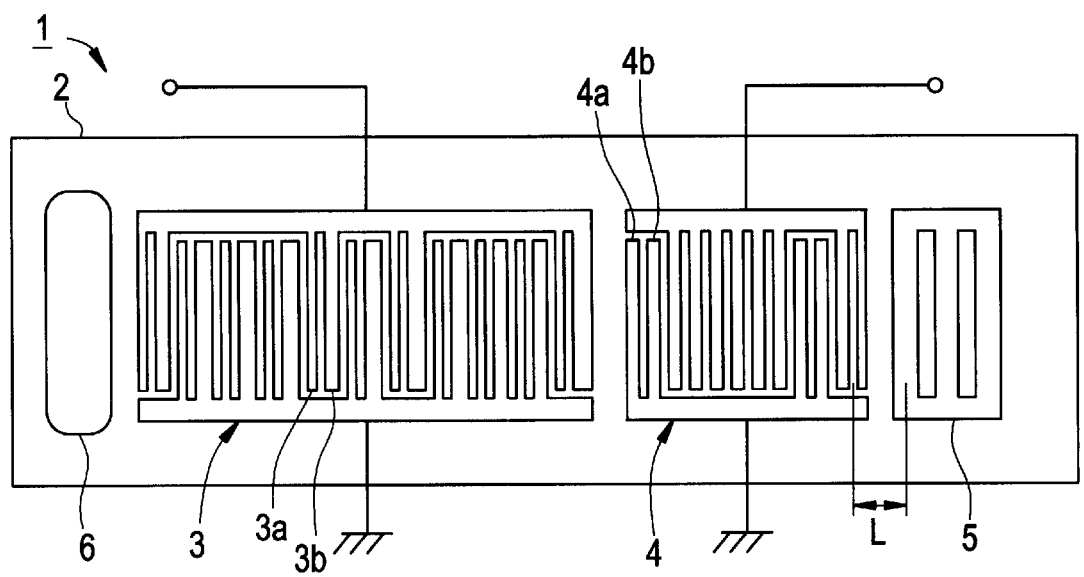
FIG. 1 is a plan view of a surface acoustic wave filter according to a first preferred embodiment of the present invention.

FIG. 1 is a plan view of a transversal surface acoustic wave filter according to a first preferred embodiment of the present invention. A surface acoustic wave filter 1 preferably includes a piezoelectric substrate 2 having a substantially rectangular sheet shape. The material constituting the piezoelectric substrate 2 is not specifically limited. For example, piezoelectric single crystals such as $LiNbO_3$, $LiTaO_3$, and $Li_2B_4O_7$, and piezoelectric ceramics such lead titanate zirconate type ceramics and other suitable materials can be used. The piezoelectric substrate 2 may be an insulating substrate made of alumina or other suitable material having a piezoelectric thin film such as a ZnO thin film or other suitable material disposed thereon.

In this preferred embodiment, the piezoelectric substrate 2 is preferably made of $Li_2B_4O_7$ of a 45° X-cut Z-propagation type.

An electrode configuration preferably made of Al, shown in FIG. 1, is disposed on the upper surface of the piezoelectric substrate 2. This electrode configuration includes an IDT 3 on the input side, an IDT 4 on the output side, and a reflector 5. The input IDT 3 and the output IDT 4 are arranged in the surface acoustic wave propagation direction. The reflector 5 is disposed on the outer area in the surface acoustic wave propagation direction of the output IDT 4.

The IDTs 3 and 4 each have a plurality of electrode fingers, and are weighted preferably by the thinning-out weighting method. The weighting of the IDTs 3 and 4 may be achieved by another method such as the apodization method or other suitable method.

The reflector 5 is preferably a grating reflector in which the both ends of a plurality of the electrode fingers are short-circuited.

The input IDT 3 is a unidirectional IDT that is formed by a known method. However, since the unidirectivity is not complete, a sound absorbing member 6 is disposed on the outer area in the surface acoustic wave propagation direction of the input IDT 3. In this preferred embodiment, the sound absorbing member 6 is formed by coating silicone resin. The material constituting the sound absorbing member 6 is not specifically limited.

Moreover, the IDT 3 is located on the input side, and the IDT 4 is located on the output side. On the contrary, the IDTs 3 and 4 may be disposed on the output and input sides, respectively.

In this preferred embodiment, the surface acoustic wave filter 1 is designed so as to have a center frequency of 380 MHz. In FIG. 1, the electrode fingers of the IDTs 3 and 4, and the reflector 5 are schematically shown. Practically, the number of the electrode finger pairs of the input IDT 3 is 230, that of the output IDT 4 is 90, and that of the reflector 5 is 60.

The input IDT 3 includes unidirectional electrodes each including electrodes 3a and 3b having different widths. Split electrodes are provided and include electrode fingers, each of which includes two electrodes having the same width and that may be combined with the unidirectional electrodes. The configuration of the unidirectional electrodes is not limited to that shown in FIG. 1. Other configurations may also be used.

On the other hand, the output IDT 4 includes split electrodes that cause no mechanical reflection, as shown in FIG. 1. That is, the IDT 4 is defined by split electrodes in which each electrode finger includes two electrodes 4a and 3b having the same width.

Each of the electrode fingers of the IDT 4 includes split electrodes. According to preferred embodiments of the present invention, not all of the electrode fingers of the IDT 4, which are adjacent to the reflector 5, necessarily include split electrodes. That is, electrode fingers which present mechanical reflection to some degree and are not split electrodes, that is, electrode fingers each including a single electrode may be arranged in the IDT 4.

Figure 2A:
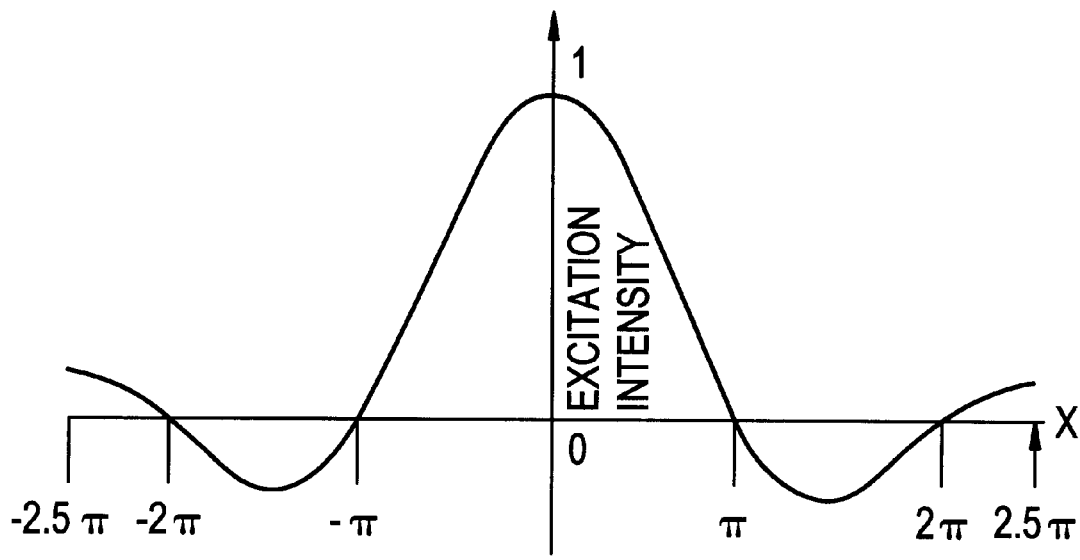
FIG. 2A illustrates the weighting of the IDT on the input side of the surface acoustic wave filter.
Figure 2B:
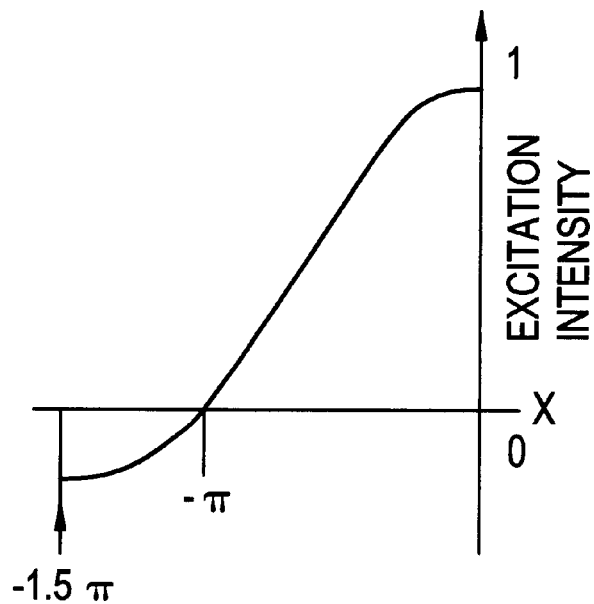
FIG. 2B illustrates the weighting of the IDT on the output side thereof.

The IDTs 3 and 4 are thinning-out weighted so as to have a desired impulse intensity distribution. FIGS. 2A and 2B illustrate the weighting of the input IDT 3 and the output IDT 4, respectively. The position in the surface acoustic wave propagation direction is plotted on the abscissa, and the excitation intensity of each electrode finger pair in the IDTs 3 and 4 is plotted on the ordinate in FIGS. 2A and 2B, respectively.

As seen in FIG. 2A, the input IDT 3 is weighted so that the excitation intensity distribution curve can be expressed substantially by sin X/X (X=−2.5π to 2.5π), and moreover, the excitation intensity distribution curve on both of the sides of the center in the surface acoustic wave propagation direction of the IDT 3 becomes symmetrical. On the other hand, the excitation intensity distribution curve of the output IDT 4 is expressed substantially by sin X/X (X=−1.5π to 0). Thus, the output IDT 4 is weighted so that the excitation intensity distribution becomes almost the same as the half of the excitation intensity distribution of the input IDT 3 produced on one side of the center in the surface acoustic wave propagation direction.

In each of FIGS. 2A and 2B, the positions of the respective electrode finger pairs are plotted on the abscissas. For example, the positions of the electrode finger pairs of the IDT 3 are plotted at the same interval in the range of about −2.5π to about 2.5π. The excitation intensity of the respective electrode pairs is plotted on the ordinate. It is to be noted that the intensity values are obtained by standardization by use of the excitation intensities of the respective electrode pairs of an assumed normal type IDT.

In the normal type IDT, positive impulses and negative impulses are alternately generated. FIGS. 2A and 2B show the intensities of the positive impulses, respectively. Accordingly, the negative intensities shown in FIGS. 2A and 2B mean that the phases of the reception signals (or transmission signals) are inverted, respectively. To realize the distributions shown in FIGS. 2A and 2B in practically used IDTs, the excitation intensities may be controlled to be higher or lower by using a thinning-out ratio, respectively. The excitation intensities in the negative regions can be produced by inverting the polarities of the electrode fingers in the IDTs, that is, inverting the phases of the signals.

In the surface acoustic wave filter of this preferred embodiment, when an input signal is applied to the input IDT 3, a surface acoustic wave is excited. Most of the surface acoustic waves propagate toward the output IDT 4, since the IDT 3 includes the unidirectional electrodes. A first electrical signal based on the propagated surface acoustic wave is output from the output IDT 4 while the wave passes through the output IDT 4. Additionally, the surface acoustic wave passed through the output IDT 4 is reflected by the reflector 5. The surface acoustic wave reflected therefrom reaches the output IDT 4 again. A second electrical signal based on the reflected surface acoustic wave is also output from the output IDT 4.

That is, the first and second electrical signals are output from the output IDT 4.

The operation carried out in the IDT 4 made when the electrical signals are output as described above will be described more particularly. For this purpose, one impulse propagated from a half of an electrode pair in the input IDT 3 to enter the output IDT 4 will be discussed. The surface acoustic wave caused by the one impulse is propagated and reaches the output IDT 4. Then, the surface acoustic wave advances from the electrode positioned near the input IDT 3 of the output IDT 4 toward the reflector 5. A portion of the energy of the surface acoustic wave caused by the impulse is output as the first electrical signal sequentially with the lapse of time when the surface acoustic wave caused by the impulse passes through the IDT 4, according to the weighting of the IDT 4. In the electrical signal that is observed with respect to the time axis, the weighting of the output IDT 4 is reproduced in the intensity of the impulse appearing sequentially with the lapse of time. That is, the weighting of the output IDT 4 is reproduced as the function of time.

The surface acoustic wave by the impulse, passed through the output IDT 4, is reflected by the reflector 5, and advances from the reflector 5 toward the output IDT4. In this case, the reflected surface acoustic wave is propagated from the electrode positioned near the reflector 5 of the output IDT 4 toward the electrode positioned remotely from the reflector 5, similarly to the above-described operation. The energy of the reflected surface acoustic wave is output as the second electrical signal sequentially with the lapse of time when the surface acoustic wave passes through each electrode, according to the weighting of the electrodes. As seen in the second electrical signal observed with respect to the time axis, the second electrical signal is output with substantially no time lag behind the above-described excitation intensity distribution show in FIG. 2B, as an electrical signal having the excitation intensity distribution shown in FIG. 2B and inverted with respect to the time axis.

Figure 3A:
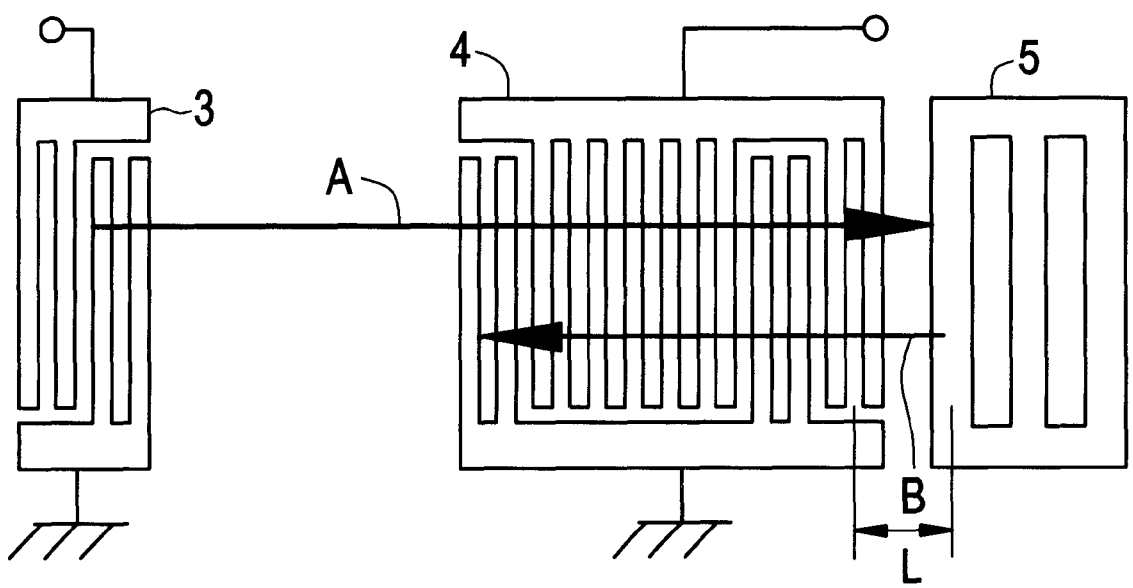
FIGS. 3A and 3B show the change of an impulse caused by a surface acoustic wave entering the output IDT in the surface acoustic wave filter of the first preferred embodiment and the change of the response of an impulse caused by the surface acoustic wave reflecting from the reflector and outputted from the output IDT when the wave passes through the output IDT.
Figure 3B:
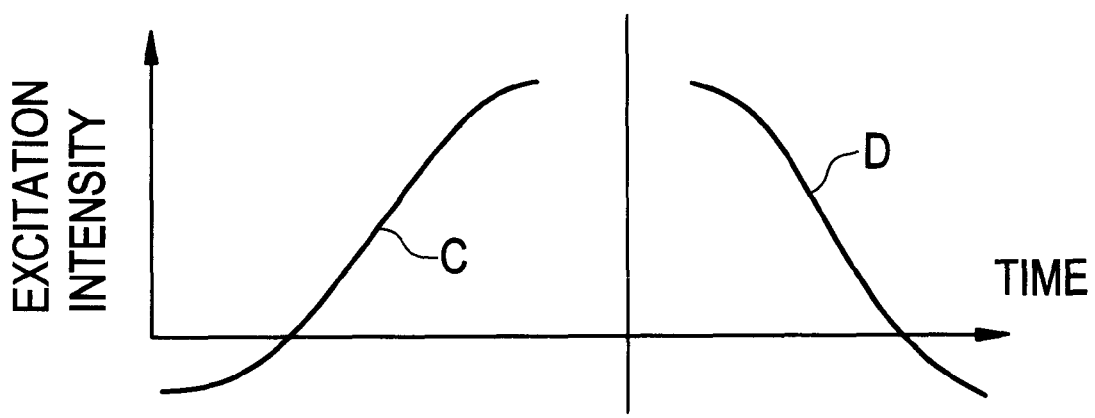

In particular, as the surface acoustic wave caused by the impulse is propagated from the input IDT 3 toward the output IDT 4 and passes through the output IDT 4 as indicated by the arrow A in FIG. 3, the first electrical signal having the impulse intensity distribution shown by the curve C depicted in the lower portion of FIG. 3 is output. When the surface acoustic wave reflected by the reflector 5 passes through the output IDT 4 as indicated by the arrow B, the second electrical signal having the impulse intensity distribution shown by the curve D depicted in the lower portion of FIG. 3 is output. Thus, the excitation intensity distribution of the weighted output IDT 4 is expressed by sin X/X (X=−1.5π to 0) as described above. However, the sum of the first and second electrical signals is substantially equivalent to an output impulse obtained by using an IDT having the number of the electrode finger pairs equal to twice that of the IDT 4 and weighted according to sin X/X (X=−1.5π to 1.5π).

That is, by arranging the reflector 5 in the predetermined position, the second electrical signal based on the reflected surface acoustic wave can be utilized. Thereby, an impulse equivalent to that obtained by using an IDT with the number of electrode finger pairs equal to twice that of the IDT 4 can be output from the output IDT 4. In this preferred embodiment, the interval between the IDT 4 and the reflector 5 is arranged such that the two-fold impulse can be output from the output IDT 4. In other words, the interval between the output IDT 4 and the reflector 5 is adjusted so as to attain the same characteristics as those obtained if the same IDT as the output IDT 4 is provided in the position where the IDT and the IDT 4 are symmetrical with respect to the imaginary reflection plane of the reflector 5.

Since the output IDT 4 includes split electrodes that do not mechanically reflect a surface acoustic wave, the surface acoustic wave causes no undesirable mechanical reflection when the wave enters and passes through the output IDT 4. The symmetry of the impulse caused by the surface acoustic wave first passing through the output IDT and the impulse caused by the surface acoustic wave reflected by the reflector 5 is improved. This facilitates the design of the output IDT 4.

Moreover, in this preferred embodiment, the reflector 5 is arranged only on the outer side in the surface acoustic wave propagation direction of the output IDT 4, and thereby, the characteristics can be improved as described above. Moreover, a second reflector, instead of the sound absorbing member 6, may be disposed on the outer area in the surface acoustic wave propagation direction of the input IDT 3.

In the case in which the second reflector is provided, a surface acoustic wave is trapped between the reflector 5 and the second reflector. This may cause a resonance phenomenon. In some cases, the resonant impulse makes ineffective the weighting of the impulse that should be output from the output IDT 4. Thus, it is preferable not to provide the second reflector.

However, in the case in which the second reflector is provided, the above-described resonance phenomenon can be suppressed as much as possible by arranging the second reflector so that the reflection ratio at the center frequency of the filter is up to about 20%. Moreover, the insertion loss in the pass band can be reduced as follows. The weighting of the input IDT 3 and the output IDT 4 is optimized including the impulse operation by positively utilizing the dwell time of the impulse caused by the weak resonance.

Figure 4:
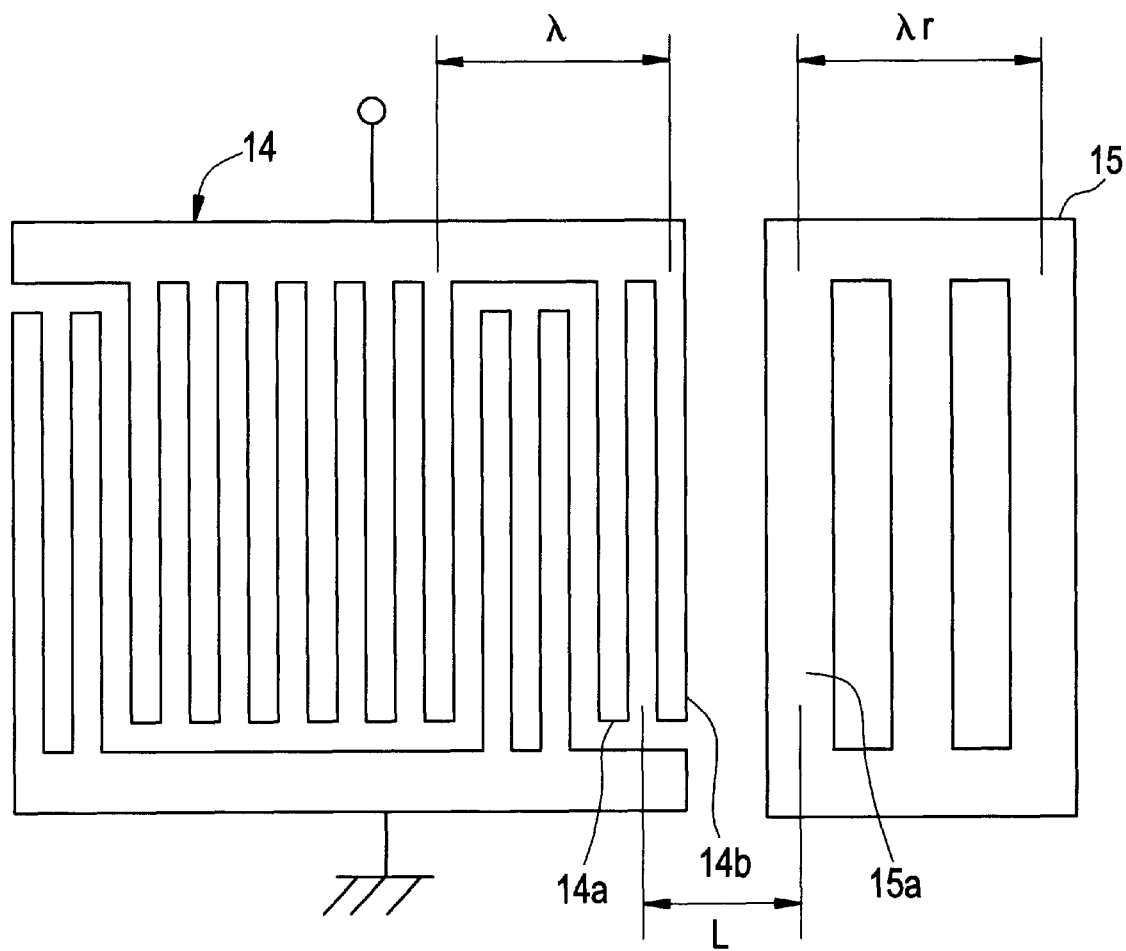
FIG. 4 is a schematic plan view of a first modification example of the transversal surface acoustic wave filter of the first preferred embodiment of the present invention.

FIG. 4 is a schematic plan view of a first modification example of the surface acoustic wave filter according to the above-described preferred embodiment. FIG. 4 shows an IDT 14 on the output side and a reflector 15 only with the other elements being omitted. First, $\lambda$ in FIG. 4 is defined as follows. The $\lambda$ written on the upper side of the output IDT 14 in FIG. 4 is substantially equal to the wavelength of a surface acoustic wave which corresponds to a desired center frequency of the surface acoustic wave filter. Moreover, $\lambda r$ written on the upper side of the reflector 15 is made slightly different from the $\lambda$ in order to correct the difference between the velocities of the surface acoustic wave, caused by the different electrode pitches in the reflector 15.

If the reflection quantity per one electrode of the reflector 15 is sufficiently large, and moreover, the stop band width of the reflector 15 is sufficiently wider than a required band width, the wavelength $\lambda r$ of the reflector 15 can be desirably changed, provided that the reflection at a desired frequency is satisfactory.

Since the wavelength $\lambda r$ of the reflector 15 can be changed to some degree as described above, the interval L between the output IDT 14 adjacent to the reflector 15 and the reflector 15 is defined by using the wavelength $\lambda$ of the output IDT 14 as a reference. The interval L is expressed as the distance between the centers of the electrode fingers of the IDT 14 and the reflector 15. That is, since the IDT 14 includes split electrodes, the center between the two electrodes 14a and 14b is defined as the center of the electrode fingers. Thus, the interval L is expressed by the distance from the center between the electrodes 14a and 14b to the center of the electrode finger 15a positioned on the output IDT 14 side of the reflector 15. In the case in which the electrode finger that is closest to the reflector 15 of the IDT 14 includes a single electrode, needless to say, the interval L is expressed by the distance between the center in the surface acoustic wave propagation direction of the single electrode and the center of the electrode finger 15a of the reflector 15. In the modification example shown in FIG. 4, the interval L is about $0.875\lambda$.

The basic operational principle of the surface acoustic wave filter of this modification example is the same as that of the surface acoustic wave filter 1 of the above-described first preferred embodiment.

Figure 5:
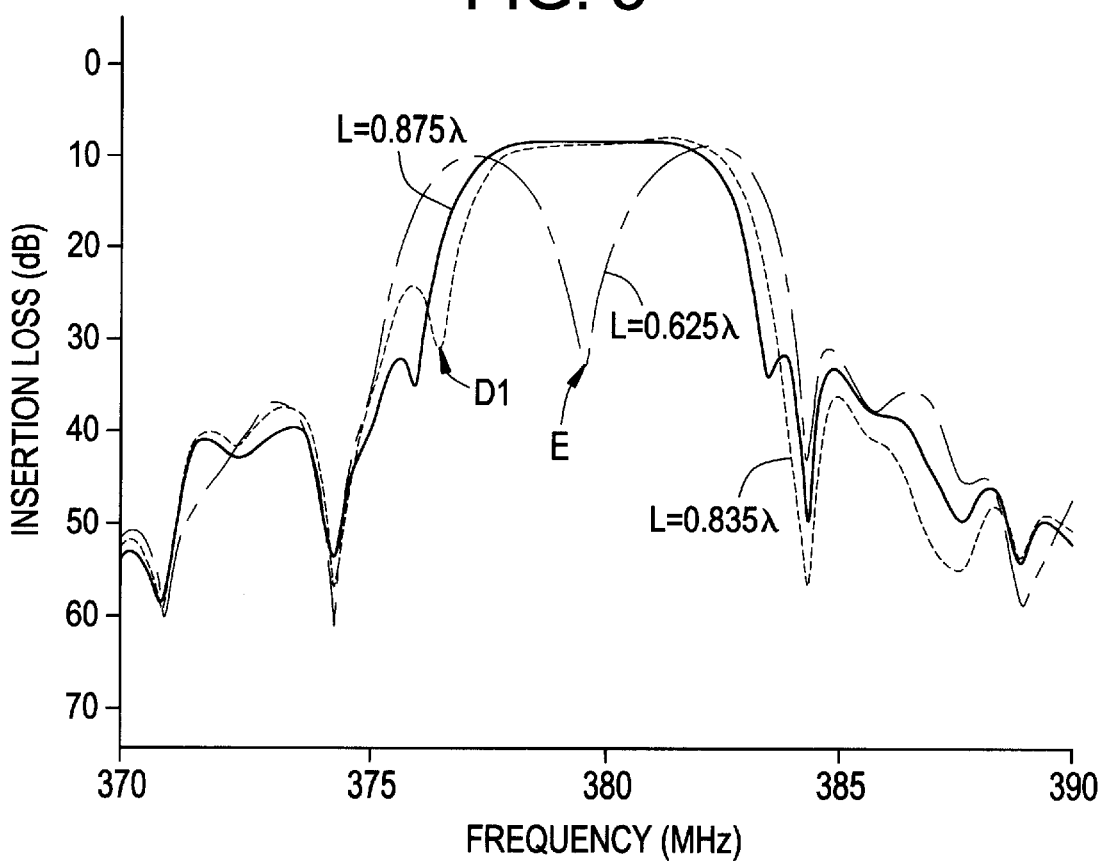
FIG. 5 is a graph showing the frequency characteristics of the transversal surface acoustic wave filter of the first modification example shown in FIG. 4 and a transversal surface acoustic wave filter prepared for comparison.

The solid line in FIG. 5 represents the attenuation frequency characteristic of the surface acoustic wave filter of this modification example. For comparison, the attenuation frequency characteristic at $L=0.835\lambda$ is represented by the broken line, and that at $L=0.625\lambda$ is represented by the alternate long and short dash line.

The characteristic is significantly changed, caused by the different intervals L, as clearly seen in FIG. 5. This means that the difference between the phase of the surface acoustic wave entering the reflector 15 and the phase thereof after the reflection considerably affects the characteristic.

In particular, at $L=0.835\lambda$, the frequency position of a ripple D1 present on the low frequency side of the pass band is shifted toward the center frequency, and the bandwidth of the pass band becomes narrow, compared to the case of the ripple at $L=0.875 \lambda$. Moreover, as seen in FIG. 5, at $L=0.625 \lambda$, a large ripple E is generated at the center frequency.

Figure 6:
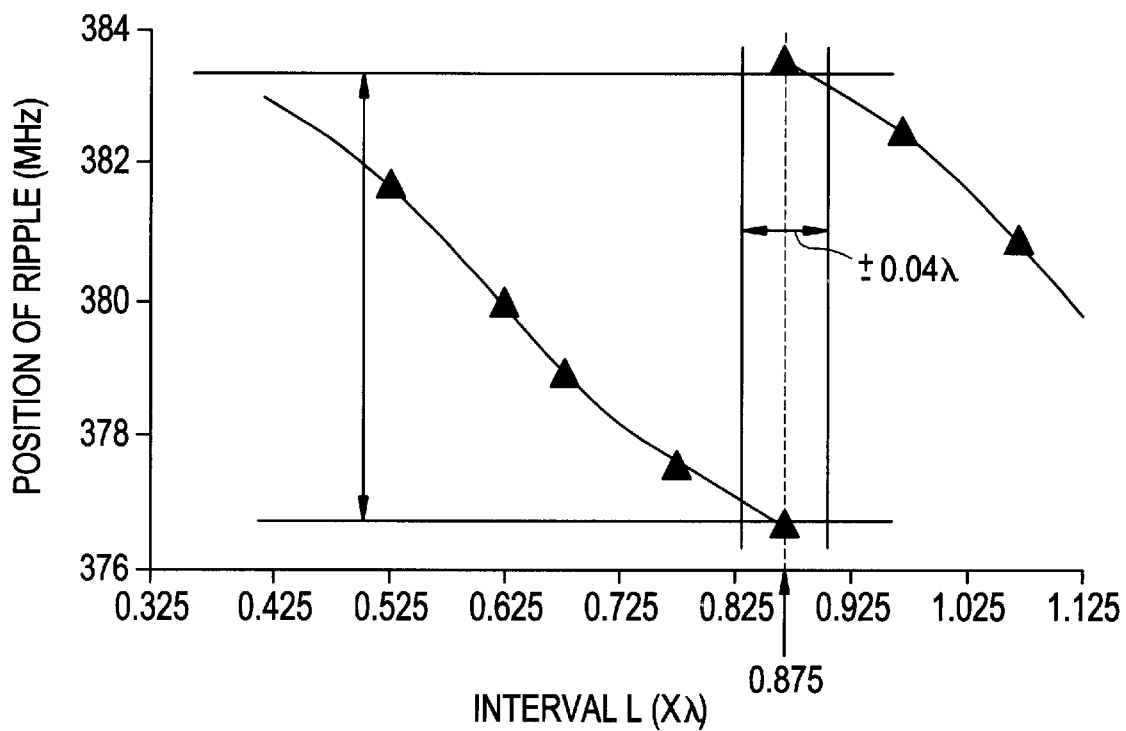
FIG. 6 is a graph showing a relation of the interval L between the IDT and the reflector in the transversal surface acoustic wave filter of the first modification example to the position at which an in-band ripple is generated.

The change of the characteristic, caused by the different intervals L, was examined in detail. FIG. 6 shows the results. In FIG. 6, the interval L is plotted on the abscissa, and the frequency position of the pole of the ripple in the pass band is plotted on the ordinate. As seen in FIG. 6, the position of the ripple in the pass band is changed in the range of 0.5 $\lambda$ and has a periodicity, caused by the varied interval L. Moreover, it is understood that the interval L at which the ripple in the pass band positions at the center frequency (380 MHz) can be expressed by $(n/2+1/8)\lambda$ in which n is a natural number). On the contrary, the interval L at which the ripple positions farthest from the pass band can be expressed by $(n/2-1/8)\lambda$.

Accordingly, the phases at the center frequency of the wave incident on the reflector 15 and the wave reflected therefrom are coincident with each other at $L=(n/2-1/8)\lambda$.

Moreover, as seen in FIGS. 5 and 6, a ripple is present near the pass band at $L=0.875 \lambda$, that is, at $L=(2/2-1/8)\lambda$. This means that there are many phase-reflex portions in the surface acoustic waves having the frequency at which the ripples are present, so that the surface acoustic waves are often cancelled out, even if the phases of the incident and reflection waves on and from the reflector 15 are coincident with each other at the center frequency.

As described above, the ripple is positioned farthest from the band at the interval $L=(n/2-1/8)\lambda$. In this case, the characteristic (solid line) at $L=0.875\lambda$ and that (alternate long and short dash line) at $L=0.625\lambda$ are compared. As a result, it is seen that for the characteristic curve (solid line) at $L=0.875\lambda$, the bandwidth is reduced, due to the ripple. Ordinarily, to reduce the bandwidth of a transversal filter, it is required to increase the number of electrode finger pairs. However, according to preferred embodiments of the present invention, by optimization of the interval L to shift the in-band ripple to the outside of the band, a satisfactory characteristic in the band can be obtained, and also, the characteristic having a narrow bandwidth can be provided without the number of electrode finger pairs being increased. In other words, a desired bandwidth can be secured, and also, the characteristic with an improved ripple near the pass band can be obtained by use of a decreased number of electrode finger pairs.

Moreover, as seen in FIGS. 5 and 6, when the interval L is shifted by $\pm 0.04 \lambda$ from the above-described $(n/2-1/8)\lambda$, the advantages of preferred embodiments of the present invention can be also obtained, and the level of the attenuation frequency characteristic is suitable for practical use. More specifically, for the characteristic obtained when the interval L is shifted by $\pm 0.04 \lambda$, the ripple is present near the end of the pass band, and the GDT is deteriorated near the ripple. Thus, it is undesirable that the ripple further approaches the pass band from the standpoint of requirement for the uniform GDT in the pass band.

As described above, a filter with good characteristics in which the attenuation near the pass band is superior, and no ripples are produced in the band, and of which the size is reduced can be realized by using the SAW filter of the first preferred embodiment and setting the interval L between the output IDT 61 and the reflector 62 to satisfy $(n/2-1/8)\lambda \pm 0.04\lambda$.

Experiments conducted by the inventor of this application has confirmed that the above-described relationship is not limited to the IDTs having the number of the electrode finger pairs and weighted which are used in the above-described preferred embodiment and the modification examples, and can be similarly obtained when the number of the electrode finger pairs and the weighting method are changed, or when another piezoelectric substrate is used.

A method in which the position of the reflector 15 is shifted by about $\lambda/8$ from a predetermined position in the surface acoustic wave propagation direction wherein the phases of an incident wave and the reflected wave are coincident with each other has been already used in unidirectional converters. For example, as described in EP 0140618B1, a unidirectional converter is realized, in which reflection strips are arranged between the IDT stages in a surface acoustic wave filter having a ladder circuit configuration, the respective reflection stripes are arranged so as to be shifted by about $\lambda/8$ from the positions spaced by about $n\lambda/2$ from the respective IDTs.

To produce a unidirectional converter according to the above-described method, the reflectors need to be dispersed in the IDT. Moreover, if it is desired that a portion of the IDT constitutes a unidirectional converter, the reflector needs to be inserted in the portion of the IDT. Moreover, the reflection quantity caused by the reflector must not be excessively large, so that the IDT on the outer side in the surface acoustic wave propagation direction of the portion having the reflector disposed therein can effectively operate.

Moreover, according to preferred embodiments of the present invention, in contrast to the above-described unidirectional converter produced by the conventional technique, the time of the impulse response to electrical signals to be output from the output IDTs 4 and 14, when observed along the time axis, is prolonged to the time taken by twice the number of the practical electrode finger pairs. Moreover, the weighting of each of the output IDTs 4 and 14 is performed symmetrically with respect to the equivalent reflection plane in the reflector. That is, the time of the impulse response is prolonged to be two-fold by weighting as shown in FIG. 3, and the impulse response is carried out by using the weighting that is symmetrical with respect to the reflection plane. Thus, a satisfactory frequency characteristic can be realized.

In this modification example, with the above-described configuration, the phases of the impulses of the incident and reflection waves are in succession without overlapping on the time axis are trued up at a desired frequency by controlling the interval L.

Figure 7:
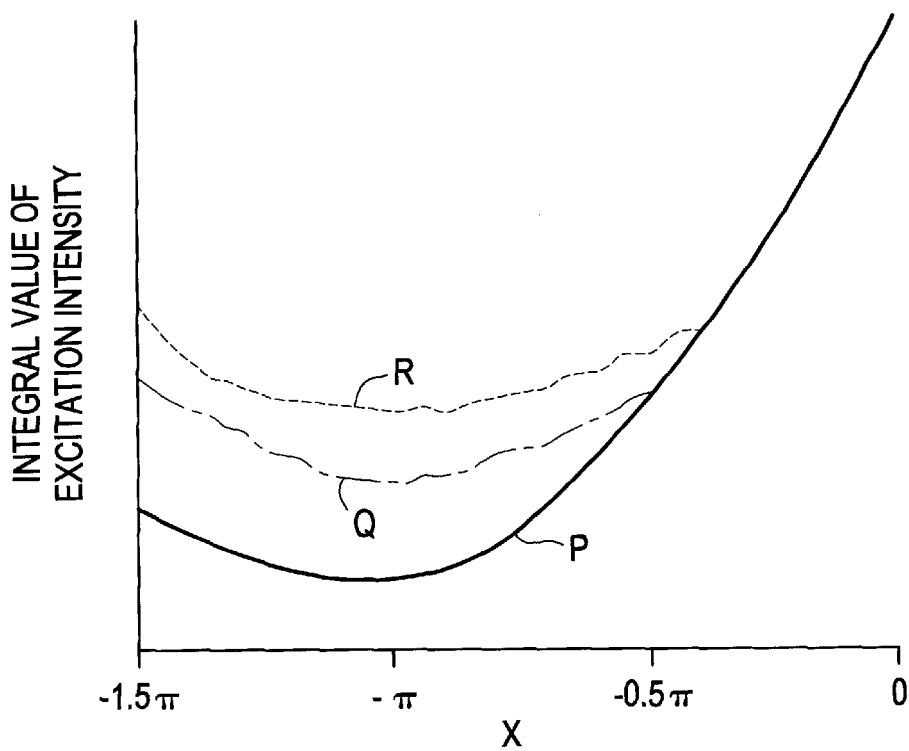
FIG. 7 is a graph illustrating a second modification example of the transversal surface acoustic wave filter of the first preferred embodiment of the present invention, in which the position in the surface acoustic wave propagation direction in the output IDT is plotted on the abscissa, and the integral value of excitation intensity is plotted on the ordinate.

FIG. 7 illustrates a second modification example according to the present invention, and shows a thinning-out weighting distribution for the output IDT 4. The second modification example is the same as the first preferred embodiment except that the thinning-out weighting of the output IDT 4 is changed. Thus, the second modification example will be described with reference to the configuration of the first preferred embodiment shown in FIG. 1.

The position in the output IDT 4 in the surface acoustic wave propagation direction is plotted on the abscissa in FIG. 7, similarly to FIG. 2. The positions of the electrode finger pairs of the output IDT are set at the same interval in the range of about $-1.5\pi$ to approximately 0. The excitation intensity integral value is plotted on the ordinate. The integral value F(x) at the position X is expressed by $$F(X) = \int_{-1.5\pi}^{X} f(y) dy,$$

in which f(x) is the excitation intensity distribution shown in FIG. 2.

The thinning-out weighting distribution of the output IDT 4 in the preferred embodiment of FIG. 1 is expressed by sin X/X (X=$-1.5\pi$ to 0). This weighting distribution is referred to as weighting P. In FIG. 7, the integral value of the excitation intensity obtained when the weighting P is used is represented by the solid line. The second modification example uses the weighting carried out in the preferred embodiment of FIG. 2 as an initial value, and optimizes it to be thinning-out weighting. Referring to the optimization, the weighting of the input IDT 3 is fixed, and the output IDT 4 is optimized. The results of the optimization depend on objective characteristics. In this case, as examples of the optimization results, weighting distributions Q and R are shown, which are represented by the alternate long and short dash line Q and the broken line R in FIG. 7, respectively.

As shown in FIG. 7, the optimized weighting distribution does not conform to a simple function such as sin X/X, but variously changes depending on desired characteristics.

On the other hand, the examination of the inventor of this application has revealed that when substantially no thinning-out is carried out in the portion near the reflector 5 of the output IDT 4, a better characteristic in the pass band can be obtained.

Figure 8:
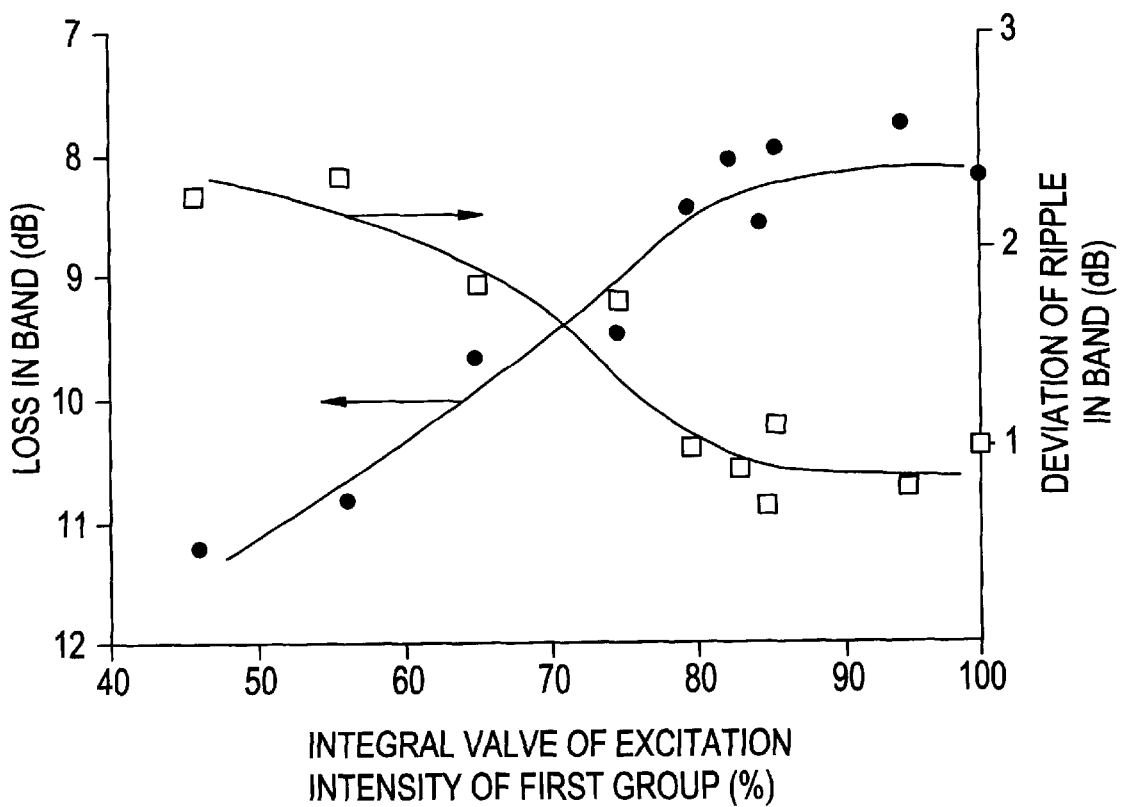
FIG. 8 is a graph illustrating the second modification example of the surface acoustic wave filter according to the first preferred embodiment of the present invention, in which the integral value of excitation intensity in the first group of the IDT which is divided into three groups is plotted on the abscissa, and the in-band insertion loss and the in-band ripple deviation are plotted on the ordinate.

FIG. 8 shows the examination results of the optimization of the weighting distribution expressed by sin X/X (X=$-1.5\pi$ to 0). The output IDT 4 is equally divided into three groups in the surface acoustic wave propagation direction, and the groups are referred to as first, second, and third groups in the order from the reflector 5 side. The integral value of the excitation intensity of the first group is plotted on the abscissa in FIG. 8. In this case, the integral value of the excitation intensity of the first group is expressed by the ratio (%) thereof based on that of the normal type IDT. The loss in the pass band and the deviation of ripples of the weighted first group are plotted on the ordinate. The optimization of the weighting is carried out with an upper limit being provided for the integral value of the excitation intensity. The results are plotted in FIG. 8. As seen in FIG. 8, when the excitation intensity integral value of the first group is at least about 80%, the loss in the pass band and the deviation of ripples are small. Accordingly, preferably, the excitation intensity integral value of the first group is set to be at least about 80% of that of the normal type IDT.

As described above, the excitation intensity integral value of the first group is set to be at least about 80% as the relative value, and thereby, the characteristic in the pass band is improved. The reason may be as follows. As described in the first preferred embodiment, the first group is configured so that the electrical signal of the impulse generated after the reflection by the reflector 5 and output from the output IDT 4 is practically prolonged to be two-fold, and the weighting is carried out, repeatedly with respect to the equivalent reflection plane in the reflector. If the weighting is performed such that a portion of the first group having the highest excitation intensity is positioned farthest from the reflector, the impulse train determined by the output IDT 4 will present two peaks having the highest peak arranged side by side along the time axis. If the function of time is Fourier-transformed, an even characteristic in the band cannot be obtained. The smaller the integral value of excitation intensity is, the more the in-band loss is deteriorated. The reason is that the deterioration by ripples is severe, and the optimization is made so that the in-band ripples are reduced even if the in-band loss is increased.

However, the above-description does not mean that when the integral value is less than about 80%, a sufficient characteristic cannot be obtained. In the practical surface acoustic wave filter, optimization is possible in the input IDT 3. Even if the filter has a characteristic insufficient to obtain a good in-band characteristic only by the impulses generated in the output IDT 4, the filter can be designed so that the input IDT 3 compensates for the deficiencies of the output IDT 4 by weighting of the input IDT 3 for excitation and combination with a unidirectional electrode.

Figure 9:
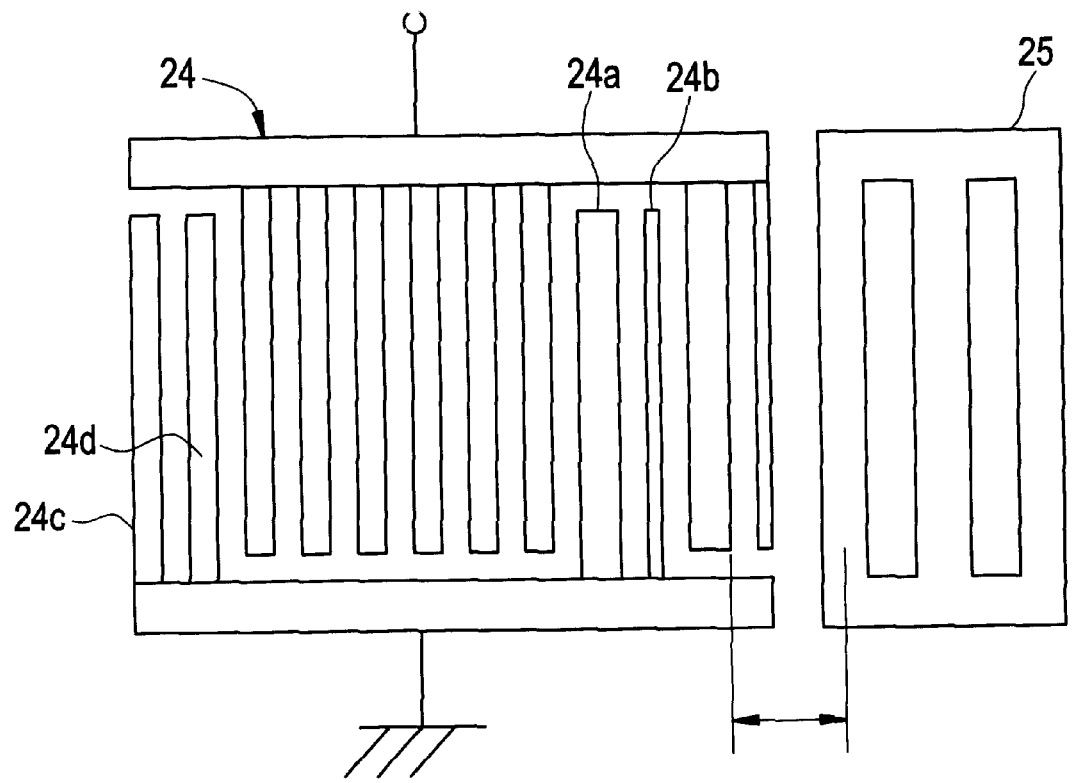
FIG. 9 is a schematic plan view showing a third modification example of the transversal surface acoustic wave filter according to the first preferred embodiment shown in FIG. 1.

FIG. 9 is a schematic plan view illustrating a third modification example of the surface acoustic wave filter of the first preferred embodiment shown in FIG. 1. In FIG. 9, only an output IDT 4 and a reflector 25 are schematically shown. In the third modification example, electrodes 24a and 24b applicable to reflect mechanically are arranged in the output IDT 24 adjacent to the reflector 25.

In the output IDT 24 of this modification example, split electrodes 24c and 24d that are incapable of reflecting mechanically are arranged in addition to the electrodes 24a and 24b applicable to reflect mechanically arranged adjacently to the reflector 25. Thereby, the position of the above-described equivalent reflection plane with respect to reflection in the reflector 25 can be shifted toward the output IDT 24. Thus, the surface acoustic wave filter can be reduced in size.

Figure 10:
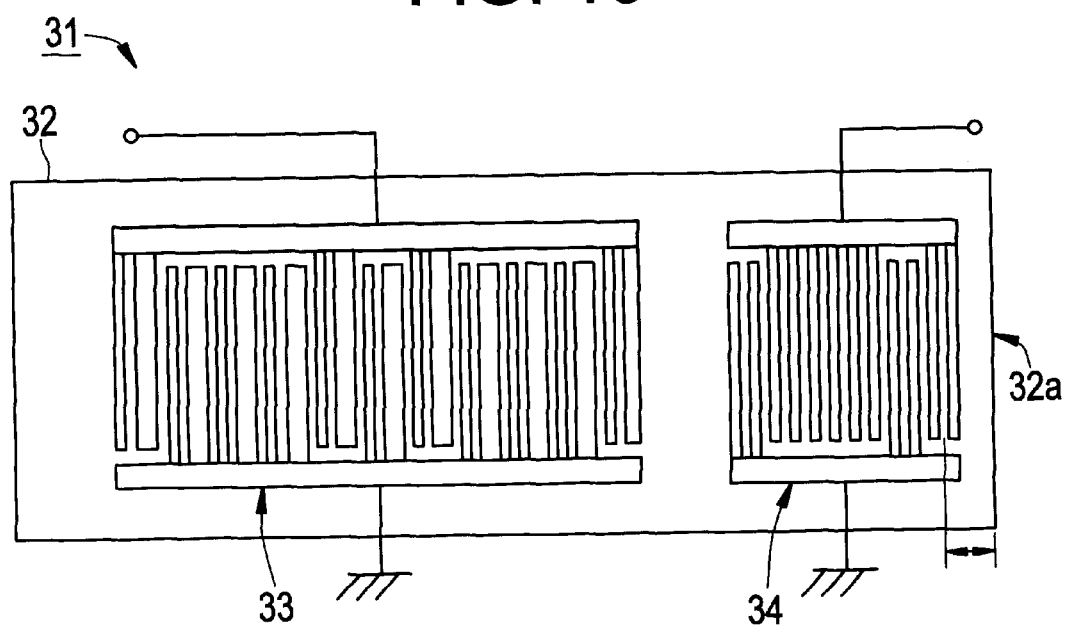
FIG. 10 is a plan view of a surface acoustic wave filter according to a second preferred embodiment of the present invention.

FIG. 10 is a plan view of a transversal surface acoustic wave filter according to a second preferred embodiment of the present invention. In the transversal surface acoustic wave filter 31 of the second preferred embodiment, an input IDT 33 and an output IDT 34 are disposed on a piezoelectric substrate 32 similarly to the first preferred embodiment shown in FIG. 1. However, no reflector is provided thereon. In the second preferred embodiment, the end surface of the piezoelectric substrate that is on the outer area in the surface acoustic wave propagation direction of the output IDT 34 functions as a reflection end surface 32a, instead of the reflector.

That is, the configuration of the surface acoustic wave filter 31 of the second preferred embodiment is preferably the same as that of the surface acoustic wave filter 1 of the first preferred embodiment shown in FIG. 1 except that the reflection end surface 32a is used instead of the reflector 5.

In the first preferred embodiment shown in FIG. 1, the interval between the IDT 4 and the reflector 5 and weighting of the IDT 4 are arranged such that the output IDT 4 and the imaginary IDT are positioned symmetrically with respect to the reflection center of the reflector 5. On the other hand, in the second preferred embodiment, the reflection end surface 32a is disposed in the same position as the reflection center of the reflector 5.

When the reflection end surface 32a is used instead of the reflector as in the second preferred embodiment, the insertion loss can be also reduced while a sufficient attenuation near the pass band is assured without the number of the electrode finger pairs of the IDT being increased, similarly to the first preferred embodiment shown in FIG. 1.

Moreover, in the second preferred embodiment, no reflector is needed. Thus, the filter can be further reduced in size.

The surface acoustic wave filter 31 of the second preferred embodiment may be modified similarly to the first preferred embodiment of FIG. 1. That is, the IDT 34 is divided with respect to the center in the surface acoustic wave propagation direction of the IDT 34 into first and second groups arranged in the order from the reflection end surface 32a side thereof. In this case, preferably, the absolute value of the excitation intensity integral value of the electrode finger pairs of the first group is larger than that of the second group, and thereby, a good band characteristic can be obtained.

Moreover, the IDT 34 adjacent to the reflection end surface 32a is divided into three groups, that is, first, second and third groups, named sequentially from the reflection end-face 32a side. In this case, the excitation intensity integral value of the electrode finger pairs of the first group is at least about 80% of that of the electrode finger pairs of the normal type IDT.

Preferably, the interval L between the IDT 34 and the reflection end surface 32a is preferably within the range of about $n\lambda/2\pm0.04\ \lambda$ (n is 0 or a natural number) as determined from the modification example of the first preferred embodiment shown in FIG. 1.

Figure 11:
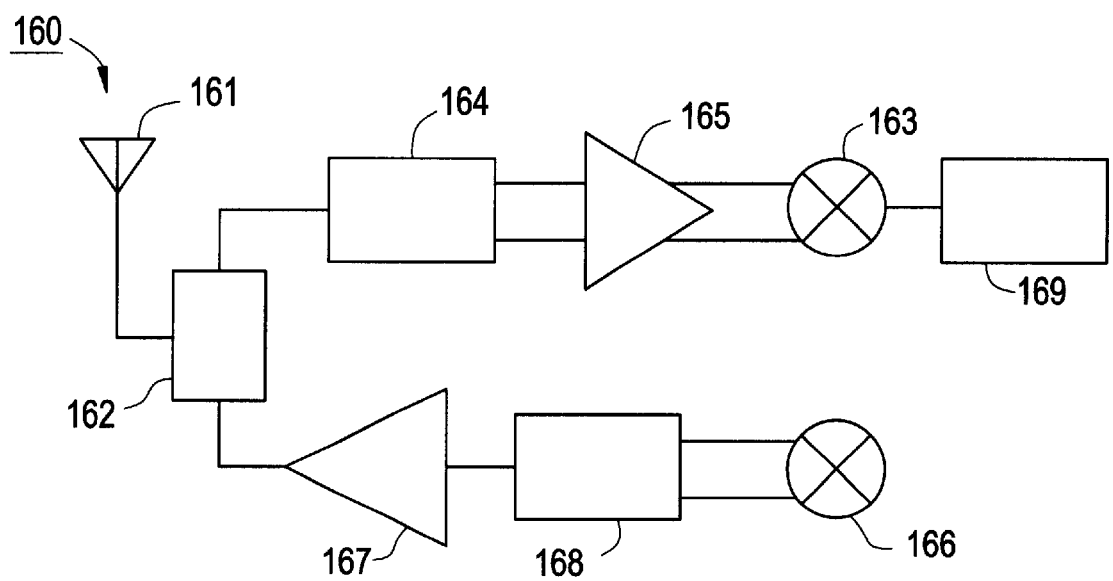
FIG. 11 is a schematic block diagram showing another example of a communication device containing a surface acoustic wave device according to preferred embodiments of the present invention.
Figure 12:
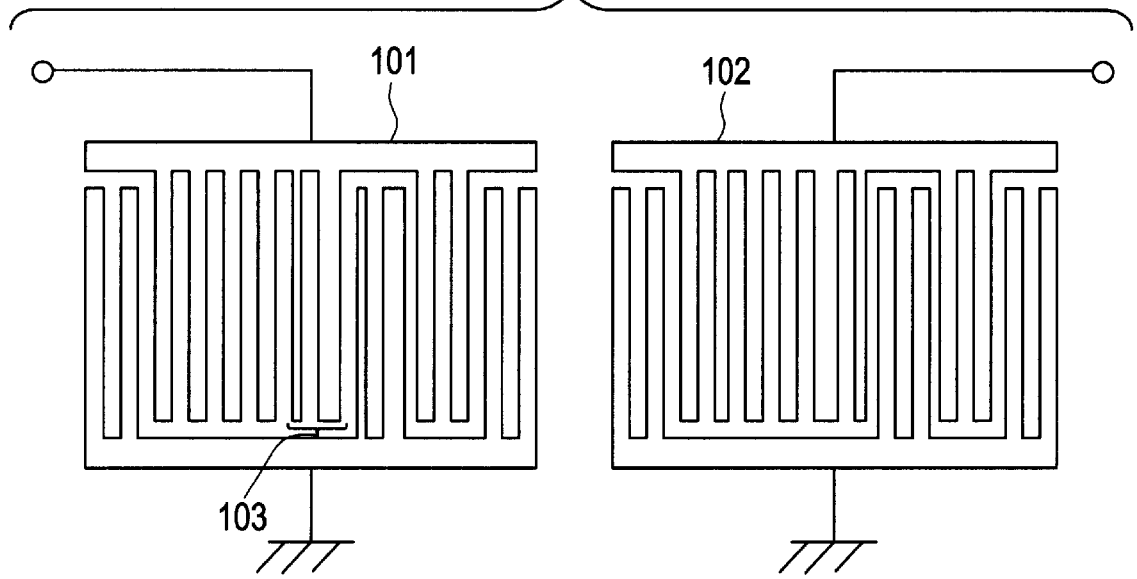
FIG. 12 is a schematic plan view of an example of a conventional transversal surface acoustic wave filter.
Figure 13:
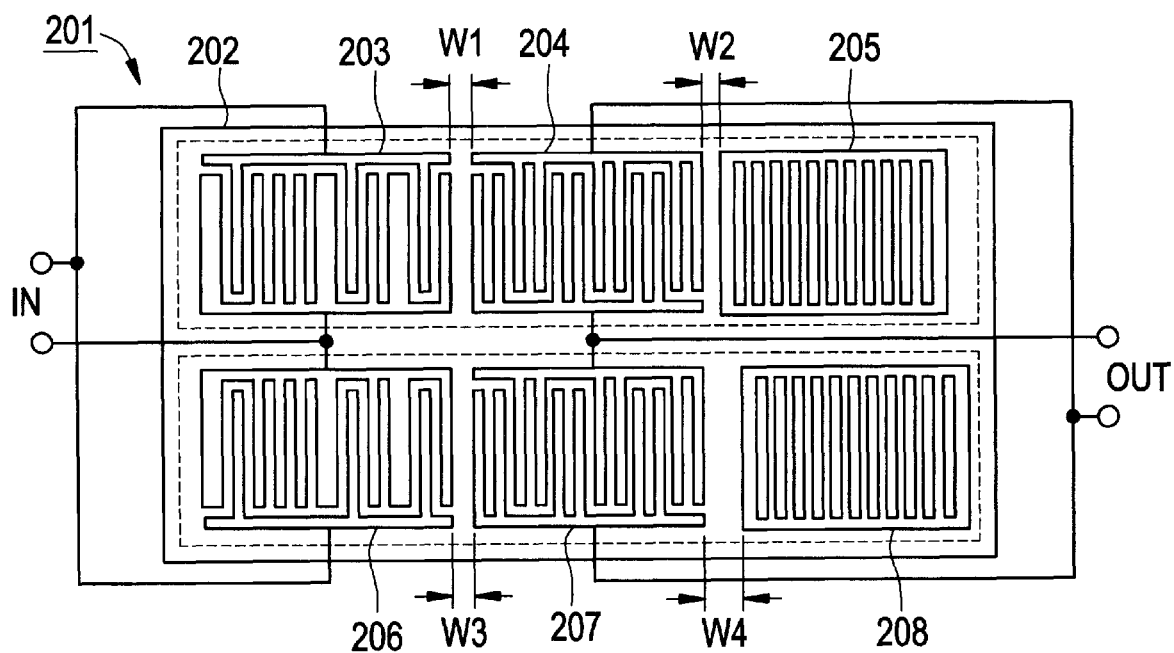
FIG. 13 is a plan view of another example of the conventional surface acoustic wave filter.

In a communication device 160 shown in FIG. 11, a duplexer 162 is connected to an antenna 161. A surface acoustic wave filter 164 and an amplifier 165 constituting the RF stage are connected between the duplexer 162 and a mixer 163 on the reception side. Moreover, a surface acoustic wave filter 165 constituting the IF stage is connected to the mixer 163. Furthermore, an amplifier 167 and a surface acoustic wave filter 168 constituting the RF stage between the duplexer 162 and a mixer 166 on the transmission side.

The surface acoustic wave filter in accordance with various preferred embodiments of the present invention is preferably used as the surface acoustic wave filter 169 in the IF stage of the communication device 160.

According to the first preferred embodiment of the present invention, while a surface acoustic wave passes through the IDT adjacent to the reflector and while the surface acoustic wave reflecting from the reflector passes through the IDT, the surface acoustic wave is converted to first and second electrical signals, respectively, and the interval between the reflector and the IDT adjacent to the reflector is set so that no phase difference is generated between the first and second electrical signals. Moreover, the IDT adjacent to the reflector is weighted so that a portion of the interdigital transducer having the highest excitation intensity is positioned on the reflector side thereof. Thus, the time of an impulse to be output from the IDT adjacent to the reflector can be increased to be about two-fold. Thus, the number of the electrode finger pairs of the IDT adjacent to the reflector can be reduced in half. Thus, the transversal surface acoustic wave filter can be greatly reduced in size.

Preferably, in the IDT adjacent to the reflector divided into a first group and a second group arranged in the order from the reflector side thereof, the absolute value of the integral value of excitation intensity of the electrode finger pairs of the first group is larger than that of the electrode finger pairs of the second group. In this case, generation of ripples in the pass band is prevented. Thus, a good band-characteristic can be obtained.

Similarly, when the IDT adjacent to the reflector is divided into a first group, a second group, and a third group arranged in the order from the reflector side thereof, the excitation intensity integral value of the electrode finger pairs of the first group is at least 80% of the excitation intensity integral value of the electrode finger pairs of an assumed first group including a normal type IDT. The insertion loss is greatly reduced, and generation of ripples in the pass band is prevented.

When the size in the surface acoustic wave propagation direction of the reflector is shorter than that of the IDT adjacent to the reflector, the reflector can be reduced in size. That is, the size of the transversal surface acoustic wave filter can be reduced.

When the reflectivity of the reflector measured at the center frequency is substantially 100%, the in-band insertion loss is prevented from being deteriorated.

When the weighted IDT includes a split electrode, the symmetry of the impulse caused by a surface acoustic wave before the reflection and the impulse caused by the surface acoustic wave reflecting from the reflector is greatly improved, since the split electrode presents no mechanical reflection.

When all of the electrode fingers of the weighted IDT are split electrodes, the symmetry of the above-described impulses can be further improved.

When the interval L between the weighted IDT and the reflector is in the range expressed by $(n/2-1/8)\lambda \pm 0.04\ \lambda$, a good filter characteristic can be obtained. That is, the attenuation near the pass band can be improved, and in-band ripples can be reduced.

In the transversal surface acoustic wave filter according to the second preferred embodiment of the present invention, while a surface acoustic wave passes through the IDT adjacent to the reflection end surface and while the surface acoustic wave reflecting from the reflection end surface passes through the IDT, the surface acoustic wave is converted to first and second electrical signals, respectively, and the interval between a reflection end surface and the IDT adjacent to the reflection end surface is set so that no phase difference is generated between the first and second electrical signals, and moreover, the IDT adjacent to the reflection end surface is weighted so that a portion of the interdigital transducer having the highest excitation intensity is positioned on the reflection side thereof. The surface acoustic wave filter can be reduced in size as well as the surface acoustic wave filter according to the first preferred embodiment of the present invention.

Preferably, the IDT adjacent to the reflection end surface is divided into a first group and a second group arranged in the order from the reflection end surface side thereof, and the absolute value of the integral value of excitation intensity of the electrode finger pairs of the first group is larger than that of the electrode finger pairs of the second group. In this case, ripples in the pass band can be eliminated, and a good band characteristic can be obtained.

Preferably, the IDT adjacent to the reflection end surface is divided into a first group, a second group, and a third group arranged in the order from the reflector side thereof, and the excitation intensity integral value of the electrode finger pairs of the first group is at least about 80% of the excitation intensity integral value of the electrode finger pairs of a assumed first group including a normal type interdigital transducer. In this case, the frequency characteristic in the pass band can be enhanced.

Preferably, the interval L between the weighted IDT and the reflector is in the range expressed by $(n\ \lambda/2 \pm 0.04\ \lambda)$. The attenuation near the pass band can be enhanced, and a good frequency characteristic with few ripples in the pass band can be obtained.

Thus, the surface acoustic wave filter can be further reduced in size, since no reflector is needed.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A transversal surface acoustic wave filter comprising:
   a piezoelectric substrate including an input side and an output side;
   an interdigital transducer on the input side and an interdigital transducer on the output side arranged in the surface acoustic wave propagation direction on the piezoelectric substrate; and
   a reflector disposed outside of one of the interdigital transducer on the input side and the interdigital transducer on the output side in the surface acoustic wave propagation direction, the interdigital transducer adjacent to the reflector being weighted;
   wherein while a surface acoustic wave passes through the interdigital transducer adjacent to the reflector and while the surface acoustic wave reflecting from the reflector passes through the interdigital transducer on the output side, the surface acoustic wave is converted to first and second electrical signals, respectively, and the interval between the reflector and the interdigital transducer adjacent to the reflector is arranged such that no phase difference is generated between the first and second electrical signals; and
   the interdigital transducer adjacent to the reflector being weighted so that a portion of the interdigital transducer having the highest excitation intensity is positioned on the reflector side thereof.

2. A transversal surface acoustic wave filter according to claim 1, wherein in the interdigital transducer adjacent to the reflector which is divided with respect to the center in the surface acoustic wave propagation direction thereof into a first group and a second group arranged in this order from the reflector side thereof, the absolute value of the integral value of excitation intensity of the electrode finger pairs of the first group is larger than that of the electrode finger pairs of the second group.

3. A transversal surface acoustic wave filter according to claim 1, wherein in the interdigital transducer adjacent to the reflector which is divided into a first group, a second group, and a third group arranged in this order from the reflector side thereof, the excitation intensity integral value of the electrode finger pairs of the first group is at least about 80% of the excitation intensity integral value of the electrode finger pairs of a group including a normal type interdigital transducer.

4. A transversal surface acoustic wave filter according to claim 1, wherein the size in the surface acoustic wave propagation direction of the reflector is shorter than that of the interdigital transducer adjacent to the reflector.

5. A transversal surface acoustic wave filter according to claim 1, wherein the reflectivity of the reflector measured at the center frequency is substantially 100%.

6. A transversal surface acoustic wave filter according to claim 1, wherein an interval L between the weighted interdigital transducer and the reflector is in the range expressed by $(n/2-1/8)\lambda \pm 0.04\ \lambda$ in which $\lambda$ is the length of one period in the weighted interdigital transducer, and n is a natural number.

7. A transversal surface acoustic wave filter according to claim 1, further comprising a reflector disposed on the outer area in the surface acoustic wave propagation direction of the interdigital transducer opposite to the weighted interdigital transducer.

8. A transversal surface acoustic wave filter according to claim 1, wherein the weighted interdigital transducer includes a split electrode.

9. A transversal surface acoustic wave filter according to claim 8, wherein all of the electrode fingers of the weighted interdigital transducer are split electrodes.

10. A transversal surface acoustic wave filter according to claim 8, further comprising an electrode that is arranged to mechanically reflect a surface acoustic wave in the weighted interdigital transducer.

11. A communication device comprising at least one of the transversal acoustic wave filter according to claim 1 defining a band-pass filter.

12. A transversal surface acoustic wave filter comprising:

a piezoelectric substrate having an input side and an output side; and an interdigital transducer on the input side and an interdigital transducer on the output side arranged in the surface acoustic wave propagation direction on the piezoelectric substrate;

an end surface of the piezoelectric substrate outside of one of the interdigital transducer on the input side and the interdigital transducer on the output side constituting a reflection end surface, the interdigital transducer adjacent to the reflection end surface being weighted;

wherein while a surface acoustic wave passes through the weighted interdigital transducer adjacent to the reflection end surface and while the surface acoustic wave reflecting from the reflection end surface passes through the interdigital transducer, the surface acoustic wave is converted to first and second electrical signals, respectively, and the interval between the reflection end surface and the interdigital transducer adjacent to the reflection end surface is set so that no phase difference is generated between the first and second electrical signals; and the interdigital transducer adjacent to the reflection end surface being weighted so that a portion of the interdigital transducer having the highest excitation intensity is positioned on the reflection end surface side thereof.

13. A transversal surface acoustic wave filter according to claim 12, wherein in the interdigital transducer adjacent to the reflection end surface which is divided with respect to the center in the surface acoustic wave propagation direction thereof into a first group and a second group arranged in this order from the reflection end surface side thereof, the absolute value of the integral value of excitation intensity of the electrode finger pairs of the first group is larger than that of the electrode finger pairs of the second group.

14. A transversal surface acoustic wave filter according to claim 12, wherein in the interdigital transducer adjacent to the reflection end surface which is divided into a first group, a second group, and a third group arranged in this order from the reflection end surface side thereof, the excitation intensity integral value of the electrode finger pairs of the first group is at least about 80% of the excitation intensity integral value of the electrode finger pairs of a group including a normal type interdigital transducer.

15. A transversal surface acoustic wave filter according to claim 12, wherein the weighted interdigital transducer includes a split electrode.

16. A transversal surface acoustic wave filter according to claim 15, wherein all of the electrode fingers of the weighted interdigital transducer are split electrodes.

17. A transversal surface acoustic wave filter according to claim 15, further comprising an electrode that is arranged to mechanically reflect a surface acoustic wave in the weighted interdigital transducer.

18. A transversal surface acoustic wave filter according to claim 12, wherein an interval L between the weighted interdigital transducer and the reflector is in the range expressed by $n\lambda/2 \pm 0.04\ \lambda$ in which n is 0 or a natural number.

19. A communication device comprising at least one of the transversal surface wave filter according to claim 12 defining a band-pass filter.

* * * * *